(12) United States Patent
Mayer et al.

(10) Patent No.: US 10,771,071 B1
(45) Date of Patent: Sep. 8, 2020

(54) REDUNDANT DCO TUNING WITH OVERLAPPING FRACTIONAL REGIONS

(71) Applicant: Intel Corporation, Santa Clara, CA (US)

(72) Inventors: Thomas Mayer, Linz (AT); Peter Preyler, Weyer (AT)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/366,122

(22) Filed: Mar. 27, 2019

(51) Int. Cl.
*H03L 7/099* (2006.01)

(52) U.S. Cl.
CPC ........ *H03L 7/0991* (2013.01); *H03L 2207/50* (2013.01)

(58) Field of Classification Search
CPC .................................................. H03L 7/0991
USPC ........................................................ 331/44
See application file for complete search history.

(56) References Cited

U.S. PATENT DOCUMENTS

| | | | | |
|---|---|---|---|---|
| 2008/0315960 A1* | 12/2008 | Waheed | ............... | G04F 10/005 331/17 |
| 2015/0102868 A1* | 4/2015 | Staszewski | ............. | H04L 27/12 332/127 |

OTHER PUBLICATIONS

Chaivipas, Win et al. "Fine and Wide Frequency Tuning Digital Controlled Oscillators Utilizing Capacitance Position Sensitivity in Distributed Resonators." IEEE Asian Solid-State Circuits Conference. Nov. 12-14, 2007/Jeju, Korea 4 pages.
Janssen, E. et al. "Chapter 2 Basics of Sigma-Delta Modulation." Look-Ahead Based Sigma-Delta Modulation, Analog Circuits and Signal Processing. Springer Science+Business Media B.V. 2011. 25 pages.
Razavi, Behzad. "The Delta-Sigma Modulator." A Circuit for All Seasons. IEEE Solid-State Circuits Magazine. Spring 2016. 6 pages.
Staszewski, Robert Bogdan et al. "Digitally Controlled Oscillator (DCO)-Based Architecture for RF Frequency Synthesis in a Deep-Submicrometer CMOS Process." IEEE Transactions on Circuits and Systems—II: Analog and Digital Signal Processing, vol. 50, No. 11, Nov. 2003. 14 pages.
Gannedahl, Rikard et al. "Digitally Controlled Oscillator for mm-Wave Frequencies." Master's Thesis. 81 pages.

(Continued)

*Primary Examiner* — Joseph Chang
(74) *Attorney, Agent, or Firm* — Eschweiler & Potashnik, LLC

(57) ABSTRACT

A digitally controlled oscillator (DCO) circuit is disclosed. The DCO circuit comprises a tuning circuit configured to tune an oscillation frequency of the DCO circuit based on processing an integer tuning codeword and a fractional tuning codeword associated with an input tuning codeword. In some embodiments, the tuning circuit comprises an integer tuning circuit configured to process the integer tuning codeword and a fractional tuning circuit configured to process the fractional tuning codeword, in order to implement the input tuning codeword. In some embodiments, the integer tuning codeword comprises an integer tuning range associated therewith and the fractional tuning codeword comprises a fractional tuning range associated therewith. In some embodiments, the fractional tuning range associated with the fractional tuning codeword is configured to cover more than one step of the integer tuning range associated with the integer tuning codeword.

29 Claims, 7 Drawing Sheets

(56) References Cited

OTHER PUBLICATIONS

Groza, R. et al. "Digitally controlled oscillator for all-digital frequency locked loops." Romanian Journal of Information Science and Technology. vol. 21, No. 1, 2018, 3-17. 15 pages.
"Digitally controlled oscillator." Wikipedia. https://en.wikipedia.org/wiki/Digitally_controlled_oscillator. 3 pages.
Smith, Elliott. "Understanding the Delta-Sigma ADC." Jul. 14, 2016. https://www.allaboutcircuits.com/technical-articles/understanding-the-delta-sigma-analog-to-digital-converter/. 10 pages.
Loloee, Arash. "Understanding Delta-Sigma Modulators." Jul. 15, 2013. https://www.electronicdesign.com/analog/understanding-delta-sigma-modulators. 16 pages.

* cited by examiner

US 10,771,071 B1

REDUNDANT DCO TUNING WITH OVERLAPPING FRACTIONAL REGIONS

FIELD

The present disclosure relates to digitally controlled oscillators (DCOs), and in particular, to a system and method for DCO tuning.

BACKGROUND

A key aspect in all modern radio transceivers is the ability to synthesize the frequency of the communication channel of interest. Adjacent communication channels can be spaced by only tens of kilohertz, while operating at several gigahertz. Therefore, the frequency synthesis must be extremely precise, otherwise different transceivers will interfere with each other. In the fifth generation of mobile communication, 5G, frequencies above 30 GHz, so-called millimeter-wave (mm-wave) frequencies are expected to play a prominent role. For the synthesis of these frequencies, the digital phase locked loop (DPLL) has recently gained much attention. A core component of the DPLL is the digitally controlled oscillator (DCO), an oscillator that tunes the frequency discretely. For good performance, the frequency steps of the DCO must be very small, while the total tuning range must be large. The DCO takes a digital word as its input and tunes its frequency discretely.

BRIEF DESCRIPTION OF THE DRAWINGS

Some examples of circuits, apparatuses and/or methods will be described in the following by way of example only. In this context, reference will be made to the accompanying Figures.

FIG. 2b depicts a tuning graph associated with the oscillator circuit of FIG. 2a.

FIG. 3b depicts a tuning graph associated with the oscillator circuit of FIG. 3a.

DETAILED DESCRIPTION

Figure 1:
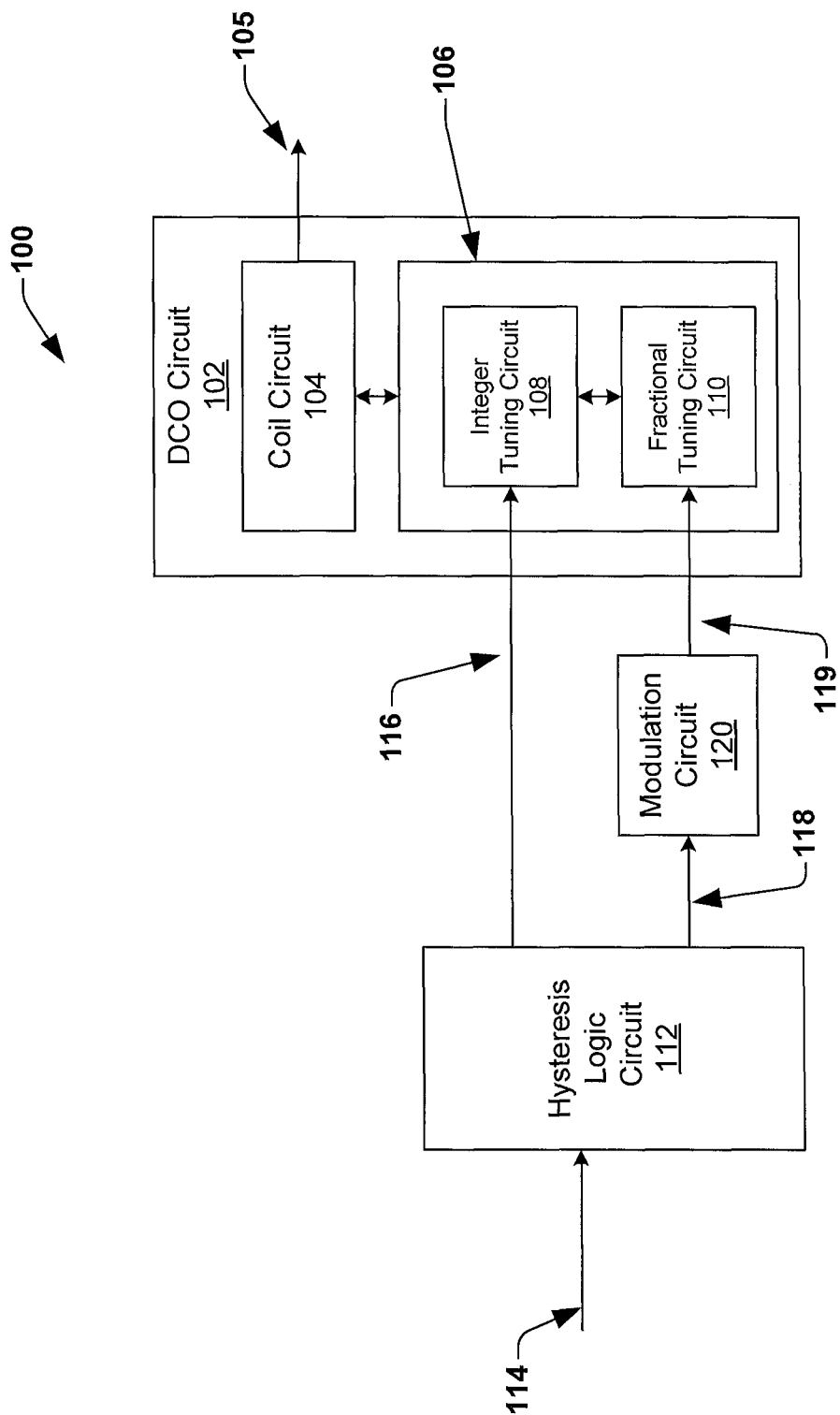
FIG. 1 illustrates a simplified block diagram of an oscillator circuit, according to one embodiment of the disclosure.

In one embodiment of the disclosure, an oscillator circuit is disclosed. The oscillator circuit comprises a digitally controlled oscillator (DCO) circuit, comprising a tuning circuit configured to tune an oscillation frequency of the DCO circuit based on processing an integer tuning codeword and a fractional tuning codeword associated with an input tuning codeword. In some embodiments, the tuning circuit comprises an integer tuning circuit comprising a plurality of integer tuning capacitors. In some embodiments, the integer tuning circuit is configured to process the integer tuning codeword based on switching the plurality of integer tuning capacitors, in order to implement the input tuning codeword. In some embodiments, the integer tuning codeword comprises an integer tuning range associated therewith. In some embodiments, the tuning circuit further comprises a fractional tuning circuit comprising a plurality of fractional tuning capacitors. In some embodiments, the fractional tuning circuit is configured to process the fractional tuning codeword based on switching the plurality of fractional tuning capacitors, in order to implement the input tuning word. In some embodiments, the fractional tuning codeword comprises a fractional tuning range associated therewith. In some embodiments, the fractional tuning range associated with the fractional tuning codeword is configured to cover more than one step of the integer tuning range associated with the integer tuning codeword.

In one embodiment of the disclosure, a digitally controlled oscillator (DCO) circuit is disclosed. The DCO circuit comprises a tuning circuit configured to tune an oscillation frequency of the DCO circuit based on processing an integer tuning codeword and a fractional tuning codeword associated with an input tuning codeword. In some embodiments, the tuning circuit comprises an integer tuning circuit comprising a plurality of integer tuning capacitors. In some embodiments, the integer tuning circuit is configured to process the integer tuning codeword based on switching the plurality of integer tuning capacitors, in order to implement the input tuning codeword. In some embodiments, the integer tuning codeword comprises an integer tuning range associated therewith. In some embodiments, the tuning circuit further comprises a fractional tuning circuit comprising a plurality of fractional tuning capacitors. In some embodiments, the fractional tuning circuit is configured to process the fractional tuning codeword based on switching the plurality of fractional tuning capacitors, in order to implement the input tuning word. In some embodiments, the fractional tuning codeword comprises a fractional tuning range associated therewith. In some embodiments, the fractional tuning range associated with the fractional tuning codeword is configured to cover more than one step of the integer tuning range associated with the integer tuning codeword.

In one embodiment of the disclosure, a method for tuning an oscillation frequency of a digitally controlled oscillator (DCO) circuit is disclosed. The method comprises processing an integer tuning codeword associated with an input tuning codeword at an integer tuning circuit comprising a plurality of integer tuning capacitors, based on switching the plurality of integer tuning capacitors, in order to implement the input tuning codeword. In some embodiments, the integer tuning codeword comprises an integer tuning range associated therewith. In some embodiments, the method further comprises processing a fractional tuning codeword associated with the input tuning codeword at a fractional tuning circuit comprising a plurality of fractional tuning capacitors, based on switching the plurality of fractional tuning capacitors, in order to implement the input tuning codeword. In some embodiments, the fractional tuning codeword comprises a fractional tuning range associated therewith. In some embodiments, the fractional tuning range associated with the fractional tuning codeword is configured to cover more than one step of the integer tuning range associated with the integer tuning codeword.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," "circuit" and the like are intended to refer to a computer-related entity, hardware, software (e.g., in execution), and/or firmware. For example, a component can be a processor (e.g., a microprocessor, a controller, or other processing device), a process running on a processor, a controller, an object, an executable, a program, a storage device, a computer, a tablet PC and/or a user equipment (e.g., mobile phone, etc.) with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the event that the terms "including", "includes", "having", "has", "with", or variants thereof are used in either the detailed description and the claims, such terms are intended to be inclusive in a manner similar to the term "comprising."

The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc. in order to provide a thorough understanding of the various aspects of various embodiments. However, it will be apparent to those skilled in the art having the benefit of the present disclosure that the various aspects of the various embodiments may be practiced in other examples that depart from these specific details. In certain instances, descriptions of well-known devices, circuits, and methods are omitted so as not to obscure the description of the various embodiments with unnecessary detail.

As indicated above, in order to achieve good performance in digitally controlled oscillators (DCOs), the frequency steps of the DCO must be kept very small, while the total tuning range must be large. In order to achieve both wide (linear) tuning range and good resolution of a digitally controlled oscillator used in digital PLLs, in some embodiments, the DCOs use integer tuning and fractional tuning. In particular, in current implementations of DCOs, the DCO is configured to tune the oscillation frequency based on processing an integer tuning codeword and a fractional tuning codeword associated with an input tuning codeword. In some embodiments, the input tuning codeword comprises a set of integer bits and a set of fractional bits. In some embodiments, the integer tuning codeword comprises a set of integer bits corresponding to the set of integer bits associated with the integer tuning codeword and the fractional tuning codeword comprises a set of fractional bits corresponding to the set of fractional bits associated with the input tuning codeword. In some embodiments, the integer tuning codeword is processed by switching unit capacitors of an integer tuning circuit comprising a plurality of integer tuning capacitors. Similarly, the fractional tuning codeword (corresponding to the fractional parts between the integers) is processed by switching unit capacitors of a fractional tuning circuit comprising a plurality of fractional tuning capacitors. In some embodiments, the fractional tuning capacitors comprises oversampled capacitors. In some embodiments, the fractional tuning codeword is converted into an oversampled integer codeword, in order to switch the oversampled capacitors. In some embodiments, the fractional tuning range associated with the fractional tuning codeword covers one step of the integer tuning codeword (i.e., the fractional parts between two adjacent integer steps).

In some embodiments, however, the integer tuning gain and the fractional tuning gain will not match exactly. This mismatch leads to a problem when the PLL operating point is at the integer transition point. A change in a tuning word is associated with a frequency jump. A small change of the tuning word within the same integer code sees a gain of the fractional (oversampled) capacitors, but a small change crossing the integer boundary (i.e., the integer transition point) may see a smaller and probably even negative gain, due to the mismatch. Effectively, this gain change leads to a changed loop gain and therefore a changed loop bandwidth. Due to the gain mismatch, in some embodiments, the loop bandwidth will be different at different operating points of the DCO. The difference can be quite large (several 100%), resulting in significantly varying loop bandwidth, which can even change dynamically due to temperature drift. In order to avoid the mismatch, in current implementations of the DCOs, the DCO design and layout are optimized for matching of the integer/fractional steps by choosing proper device sizes and regular structures. The bandwidth variation problem gets more severe the larger the step size of the DCO gets, because the tuning activity gets smaller relative to the step size (and the absolute mismatch). But if a large fine tuning range is desired, then a large step size helps to keep the number of unit capacitors in the tuning array small and therefore improves the quality factor/noise of the DCO. Therefore, matching accuracy achieved by regular design/layout may be insufficient for such DCOs with a large linear tuning range.

In order to overcome the above disadvantages, a system and a method for a DCO circuit is proposed in this disclosure. In particular, a DCO circuit that enables to cover with the fractional tuning range associated with the fractional tuning codeword more than one step of the integer tuning range associated with the integer tuning codeword, in order to create overlapping (redundant) fractional tuning regions is proposed herein. In some embodiments, a hysteresis logic circuit is utilized for the selection of the redundant tuning regions to avoid excessive toggling of integer tuning capacitors. In some embodiments, by allowing overlapping fractional regions, the DCO design constraints can be relaxed, as a higher mismatch between integer and fractional tuning can be allowed, which enables realizing DCOs with larger step size and larger fine tune range.

FIG. 1 illustrates a simplified block diagram of an oscillator circuit 100, according to one embodiment of the disclosure. In some embodiments, the oscillator circuit 100 may be included with radio transceiver circuits in communication systems. In some embodiments, the oscillator circuit 100 may be part of digital phase locked loops (DPLLs). The oscillator circuit 100 comprises a digitally controlled oscillator (DCO) circuit 102 configured to generate an output signal 105 at a predefined oscillation frequency. In some embodiments, the DCO circuit 102 comprises a coil circuit 104 and a tuning circuit 106. In some embodiments, the coil circuit 104 comprises an inductor. In some embodiments, the tuning circuit 106 is configured to tune the oscillation frequency of the DCO circuit 102. In some embodiments, the tuning circuit 106 is configured to tune the oscillation frequency of the DCO circuit 102 based on processing an input tuning codeword (e.g., the input tuning codeword 114). In some embodiments, the input tuning codeword comprises a set of integer bits and a set of fractional bits.

In some embodiments, the tuning circuit 106 is configured to tune the oscillation frequency of the DCO circuit 102 based on processing an integer tuning codeword 116 and a fractional tuning codeword 118 associated with the input tuning codeword 114. In some embodiments, the integer tuning codeword 116 comprises an integer tuning range (i.e., a frequency range) associated therewith. In some embodiments, the integer tuning range comprises a plurality of steps of integer tuning frequencies. Similarly, in some embodiments, the fractional tuning codeword 118 comprises a fractional tuning range (i.e., a frequency range) associated therewith. In some embodiments, the fractional tuning range comprises a plurality of steps of fractional tuning frequencies. In some embodiments, the fractional tuning range associated with the fractional tuning codeword 118 is smaller than the integer tuning range associated with the integer tuning codeword 116. Further, the fractional tuning range associated with the fractional tuning codeword 118 is configured to cover more than one step of the integer tuning range associated with the integer tuning codeword 116, further details of which are given in embodiments below.

In some embodiments, the tuning circuit 106 comprises an integer tuning circuit 108 and a fractional tuning circuit 110. In some embodiments, the integer tuning circuit 108 may comprise a plurality of integer tuning capacitors. In some embodiments, the integer tuning circuit 108 is configured to process the integer tuning codeword 116 based on switching the plurality of integer tuning capacitors, in order to implement the input tuning codeword 114. In some embodiments, the fractional tuning circuit 110 may comprise a plurality of fractional tuning capacitors. In some embodiments, the fractional tuning circuit 110 is configured to process the fractional tuning codeword 118 based on switching the plurality of fractional tuning capacitors, in order to implement the input tuning word 114. In some embodiments, the fractional tuning circuit 110 is configured to process the fractional tuning codeword 118 based on processing an oversampled integer codeword 119 derived based on the fractional tuning codeword 118. In some embodiments, the oversampled integer codeword 119 comprises an oversampled version of the fractional tuning codeword 118.

In order to cover with the fractional tuning range, more than one step of the integer tuning range, in some embodiments, one or more redundant bits are utilized. In particular, in some embodiments, the one or more redundant bits comprises one or more redundant integer bits. In such embodiments, the integer tuning codeword 116 comprises a set of integer bits (e.g., N integer bits) corresponding to the set of integer bits associated with the input tuning codeword 114, and the fractional tuning codeword 118 comprises a set of fractional bits corresponding to the set of fractional bits associated with the input tuning codeword 114 and one or more redundant integer bits. In some embodiments, the one or more redundant integer bits associated with the fractional tuning codeword are redundant with respect to one or more bits (e.g., least significant bits (LSBs)) associated with the integer tuning codeword.

Alternately, in other embodiments, the one or more redundant bits comprises one or more redundant fractional bits. In such embodiments, the integer tuning codeword 116 comprises a set of integer bits corresponding to the set of integer bits associated with the input tuning codeword 114 and one or more redundant fractional bits. Further, the fractional tuning codeword comprises a set of fractional bits corresponding to the set of fractional bits associated with the input tuning codeword 114. In some embodiments, the one or more redundant fractional bits associated with the integer tuning codeword are redundant with respect to one or more bits (e.g., most significant bits (MSBs)) associated with the fractional tuning codeword.

In some embodiments, the oscillator circuit 100 further comprises a hysteresis logic circuit 112 configured to receive the input tuning codeword 114, and to split the input tuning codeword 114 to form the integer tuning codeword 116 and the fractional tuning codeword 118. In some embodiments, the hysteresis logic circuit 112 is configured to split the input tuning codeword 114, based on a change direction of the input tuning codeword 114, further details of which are provided in embodiments below. In particular, in the embodiments where the redundant bit comprises redundant integer bits, the hysteresis logic circuit 112 is configured to set the redundant integer bits associated with the fractional tuning codeword 118, based on the change direction of the input tuning codeword 114, in order to derive the fractional tuning codeword 116. Further, in the embodiments where the redundant bit comprises redundant fractional bits, the hysteresis logic circuit 112 is configured to set the redundant fractional bits associated with the integer tuning codeword 116, based on the change direction of the input tuning codeword 114, in order to derive the integer tuning codeword 116. In some embodiments, by utilizing the change direction of the input tuning codeword to split the input tuning codeword 114, the hysteresis logic circuit 112 reduces the excessing toggling of the integer tuning capacitors. In other embodiments, however, the hysteresis logic circuit 112 may be configured to split the input tuning codeword 114, based on some other criteria. In some embodiments, the hysteresis logic circuit 112 is configured to split the input tuning codeword 114 to form the integer tuning codeword 116 and the fractional tuning codeword 118 in such a way that the sum of the integer tuning codeword 116 and the fractional tuning codeword 118 always results in the input tuning codeword 114. In some embodiments, the oscillator circuit 100 further comprises a modulation circuit 120 configured to convert the fractional tuning codeword 118 to the oversampled integer codeword 119. In some embodiments, the modulation circuit 120 comprises a delta-signal modulator that utilizes delta-sigma modulation to convert the fractional tuning codeword 118 to the oversampled integer codeword 119. However, in other embodiments, the modulation circuit 120 may be implemented differently.

Figure 2A:
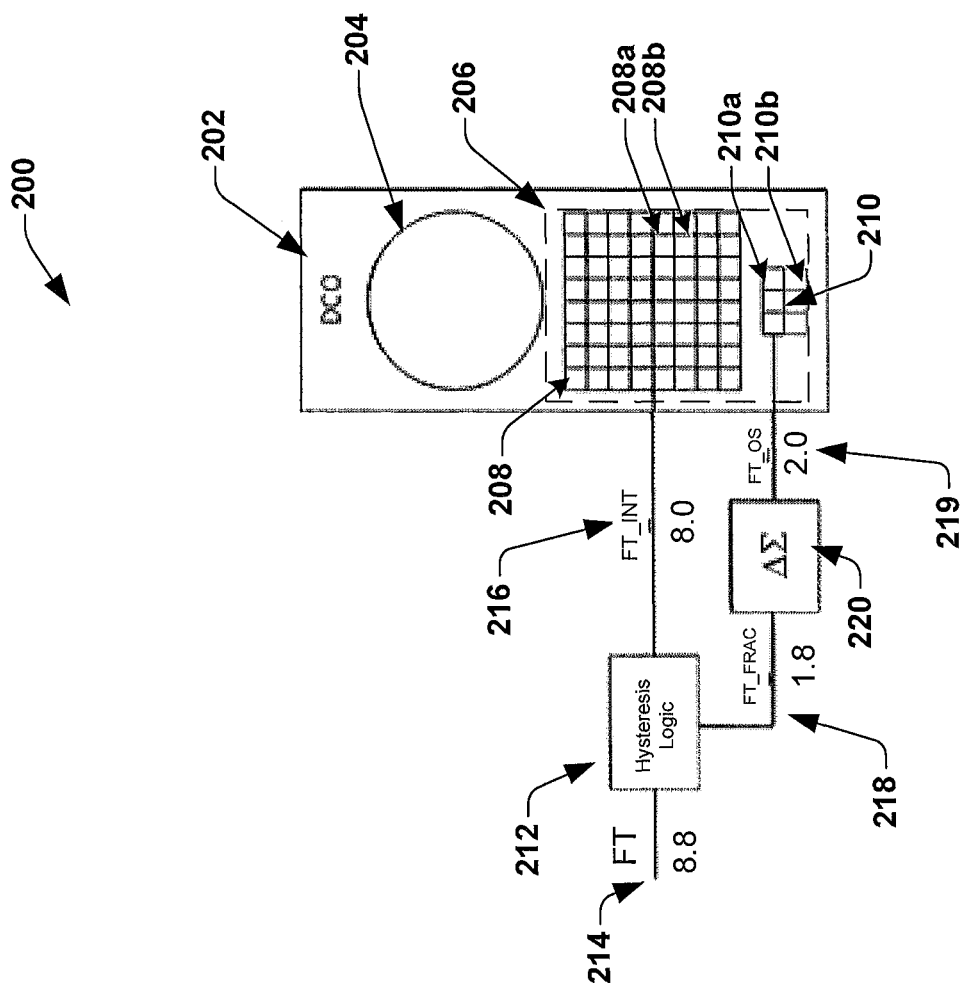
FIG. 2a illustrates an example implementation of an oscillator circuit, according to one embodiment of the disclosure.

FIG. 2a illustrates an example implementation of an oscillator circuit 200, according to one embodiment of the disclosure. In some embodiments, the oscillator circuit 200 comprises one possible way of implementation of the oscillator circuit 100 in FIG. 1. In some embodiments, the oscillator circuit 200 is configured to process an input tuning codeword based on processing an integer tuning codeword and a fractional tuning codeword. In some embodiments, the fractional tuning codeword comprises one or more redundant integer bits associated therewith. In some embodiments, the oscillator circuit comprises a digitally controlled oscillator circuit 202, a hysteresis logic circuit 212 and a modulation circuit 220. In some embodiments, the DCO circuit 202 is configured to generate an output signal at a predefined oscillation frequency. In some embodiments, the DCO circuit 202 comprises a coil circuit 204 and a tuning circuit 206. In some embodiments, the coil circuit 204 comprises an inductor. In some embodiments, the tuning circuit 206 is configured to tune the oscillation frequency of the DCO circuit 202. In some embodiments, the tuning circuit 206 is configured to tune the oscillation frequency of the DCO circuit 202 based on processing an input tuning codeword (e.g., the input tuning codeword 214).

In some embodiments, the input tuning codeword comprises a set of integer bits and a set of fractional bits. In this embodiment, the input tuning codeword 214 is shown to be an 8.8 bit codeword comprising 8 integer bits and 8 fractional bits. However, in other embodiments, the input tuning codeword 214 may comprise a N.M bits codeword comprising N integer bits and M fractional bits, where N and M can be any number. In some embodiments, the tuning circuit 206 is configured to tune the oscillation frequency of the DCO circuit 202 based on processing an integer tuning codeword 216 and a fractional tuning codeword 218 associated with the input tuning codeword 214. In some embodiments, the integer tuning codeword 216 comprises an integer tuning range associated therewith and the fractional tuning codeword 218 comprises a fractional tuning range associated therewith.

In some embodiments, the tuning circuit 204 comprises an integer tuning circuit 208 and a fractional tuning circuit 210. In some embodiments, the integer tuning circuit 208 comprises a plurality of integer tuning capacitors 208a, 208b etc. In some embodiments, the integer tuning circuit 208 is configured to process the integer tuning codeword 216 based on switching the plurality of integer tuning capacitors, in order to implement the input tuning codeword 214. In some embodiments, the fractional tuning circuit 210 comprises a plurality of fractional tuning capacitors. In some embodiments, the fractional tuning circuit 210 is configured to process the fractional tuning codeword 218 based on switching the plurality of fractional tuning capacitors, in order to implement the input tuning word 214. In some embodiments, the fractional tuning circuit 210 is configured to process the fractional tuning codeword 218 based on processing an oversampled integer codeword 219 derived based on the fractional tuning codeword 218. In some embodiments, the oversampled integer codeword 219 comprises an oversampled version of the fractional tuning codeword 218. In some embodiments, the modulation circuit 220 is configured to convert the fractional tuning codeword 218 to the oversampled integer codeword 219.

In this embodiment, the fractional tuning range associated with the fractional tuning codeword 218 is configured to cover two steps of the integer tuning range associated with the integer tuning codeword 116. However, in other embodiments, the fractional tuning range associated with the fractional tuning codeword 218 may be configured to cover more than two steps of the integer tuning range associated with the integer tuning codeword 216. In order to cover with the fractional tuning range, two steps of the integer tuning range, in this embodiment, a redundant integer bit is utilized. In particular, in this embodiment, the integer tuning codeword 216 comprises 8 integer bits (corresponding to the 8 integer bits of the input tuning codeword 214) and the fractional tuning codeword 218 comprises a redundant integer bit in addition to 8 fractional bits (corresponding to the 8 fractional bits of the input tuning codeword 214). Therefore, in this embodiment, the integer tuning codeword 216 comprises an 8 bit codeword and the fractional tuning codeword 218 comprises a 1.8 bit codeword. In some embodiments, the redundant integer bit associated with the fractional tuning codeword 218 comprises a most significant bit (MSB) of the fractional tuning codeword 218. In some embodiments, the redundant integer bit (i.e., the MSB) associated with the fractional tuning codeword 218 is redundant to a least significant bit (LSB) of the integer tuning codeword 216. In other embodiments, however, the redundant integer bit associated with the fractional tuning codeword 218 may comprise two or more redundant integer bits (i.e., the redundant region covers more than 1 LSB of the integer tuning codeword 216), in order to enable the fractional tuning range to cover more than two steps of the integer tuning range. For example, in one example embodiment, the fractional tuning codeword 218 may comprise two redundant integer bits, in order to enable the fractional tuning range to cover up to 4 steps of the integer tuning range. In such embodiments, the two or more redundant integer bits are configured to be redundant to two or more bits (e.g., LSBs) associated with the integer tuning codeword 216.

In some embodiments, the plurality of integer tuning capacitors associated with the integer tuning circuit 208 comprises a plurality of unit capacitors. In this embodiment, the plurality of integer tuning capacitors comprises 256 unit capacitors configured to process the 8 bit integer tuning codeword 216. However, in other embodiments, the plurality of integer tuning capacitors may be implemented differently, based on the number of bits associated with the integer tuning codeword 216. Similarly, in some embodiments, the plurality of fractional tuning capacitors associated with the fractional tuning circuit 210 comprises a plurality of unit capacitors. In this embodiment, the plurality of fractional tuning capacitors comprises 6 unit capacitors configured to process the 2 bit oversampled codeword 219 derived based on the 1.8 fractional tuning codeword 216. However, in other embodiments, the plurality of fractional tuning capacitors may be implemented differently, based on the number of bits associated with the fractional tuning codeword 216.

In some embodiments, the redundant integer bit enables to create overlapping fractional regions. In particular, in this embodiment, due to the redundant integer bit in the fractional tuning codeword, the fractional tuning range covers 2 steps of the integer tuning range, thereby forming overlapping fractional regions. As a result of the overlapping fractional regions, at any instance, an input tuning codeword can be implemented using two possible integer tuning codes and their associated fractional tuning codes, as can be seen in the tuning graph 250 in FIG. 2*b*. In some embodiments, the x-axis of the tuning graph 250 depicts the integer tuning codeword (e.g., the integer tuning codeword 216) and the y-axis of the tuning graph 250 depicts the effective input tuning codeword (e.g., the input tuning codeword 214). In order to implement an input tuning codeword of 1.5, in one instance, the integer tuning codeword may be set to 0 and the fractional tuning codeword may be set to 1.5. However, in another instance, the integer tuning codeword may be set to 1 and the fractional tuning codeword may be set to 0.5, in order to implement the input tuning codeword of 1.5.

Figure 2B:
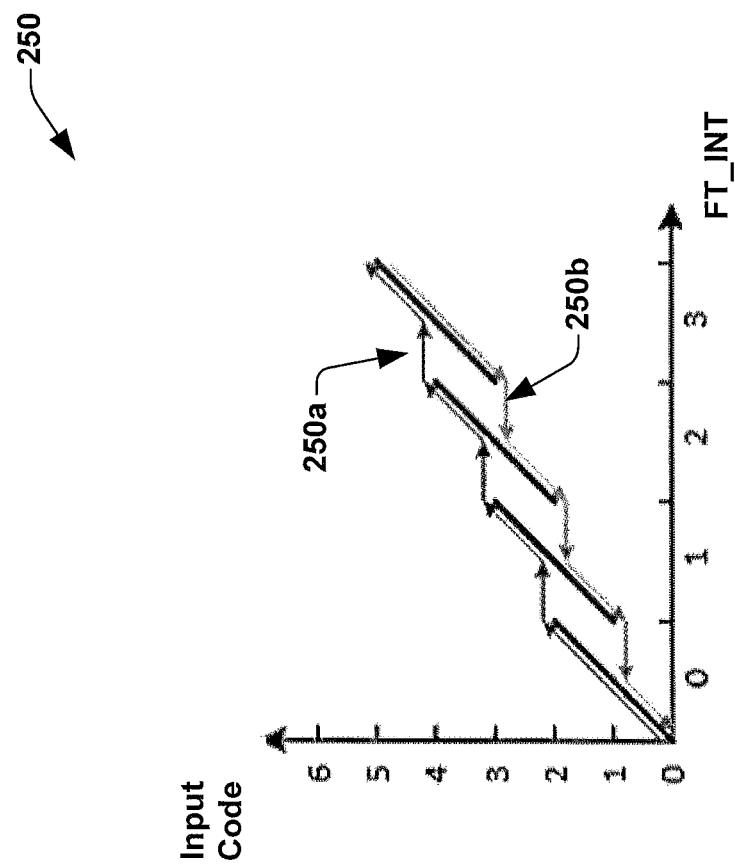

In some embodiments, the integer tuning codeword 216 and the fractional tuning codeword 218 is set, based on the input tuning codeword 214, in accordance with a change direction of the input tuning codeword 214. In particular, in some embodiments, the redundant integer bit associated with the fractional tuning codeword 218 is set, in accordance with the change direction of the input tuning codeword. For example, as can be seen in FIG. 2*b*, if the input tuning codeword 214 is increasing, the redundant integer bit associated with the fractional tuning codeword 218 is set in accordance with the tuning curve 250*a*. Similarly, if the input tuning codeword 214 is decreasing, the redundant integer bit associated with the fractional tuning codeword is set in accordance with the tuning curve 250*b*. In particular, if the change direction of the input tuning codeword is from 0 to 1.5, then the input tuning codeword of 1.5 is implemented by setting the integer tuning codeword to 0 and the fractional tuning codeword to 1.5 (based on setting the redundant integer bit to 1, in accordance with the tuning curve 250*a*). Similarly, if the change direction of the input tuning codeword is from 2 to 1.5, then the input tuning codeword of 1.5 is implemented by setting the integer tuning codeword to 1 and the fractional tuning codeword to 0.5 (based on setting the redundant integer bit to 0, in accordance with the tuning curve 250*b*). However, in other embodiments, the integer tuning codeword 216 and the fractional tuning codeword 218 may be set, based on some other criteria.

Referring back to FIG. 2*a*, in some embodiments, the oscillator circuit 200 further comprises a hysteresis logic circuit 212 configured to receive the input tuning codeword 214, and split the input tuning codeword 214 to form the integer tuning codeword 216 and the fractional tuning codeword 218. In some embodiments, the hysteresis logic circuit 212 is configured to set the integer tuning codeword 216 and the fractional tuning codeword 218, based on the input tuning codeword 214, in accordance with the change direction of the input tuning codeword 214, as explained above. In particular, in some embodiments, the hysteresis logic circuit 212 is configured to set the redundant integer bit associated with the fractional tuning codeword 218, in accordance with the change direction of the input tuning codeword 214, in order to derive the fractional tuning codeword 218. However, in other embodiments, the hysteresis logic circuit 212 may be configured to set the redundant integer bit associated with the fractional tuning codeword 218 based on some other criteria. Upon determining the fractional tuning codeword 216, in some embodiments, the hysteresis logic circuit 212 is configured to subtract the fractional tuning codeword 218 from the input tuning codeword, in order to derive the integer tuning codeword 216. Therefore, in some embodiments, the hysteresis logic circuit 212 may be configured to split the input tuning codeword into a first integer tuning codeword and a corresponding first fractional tuning codeword, for increasing input tuning codeword, and the hysteresis logic circuit 212 may be configured to split the input tuning codeword into a second, different, integer tuning codeword and a corresponding second fractional tuning codeword, for decreasing input tuning codeword. However, in other embodiments, the hysteresis logic circuit 212 may be configured to set the integer tuning codeword 216 and the fractional tuning codeword 218, differently.

Figure 3A:
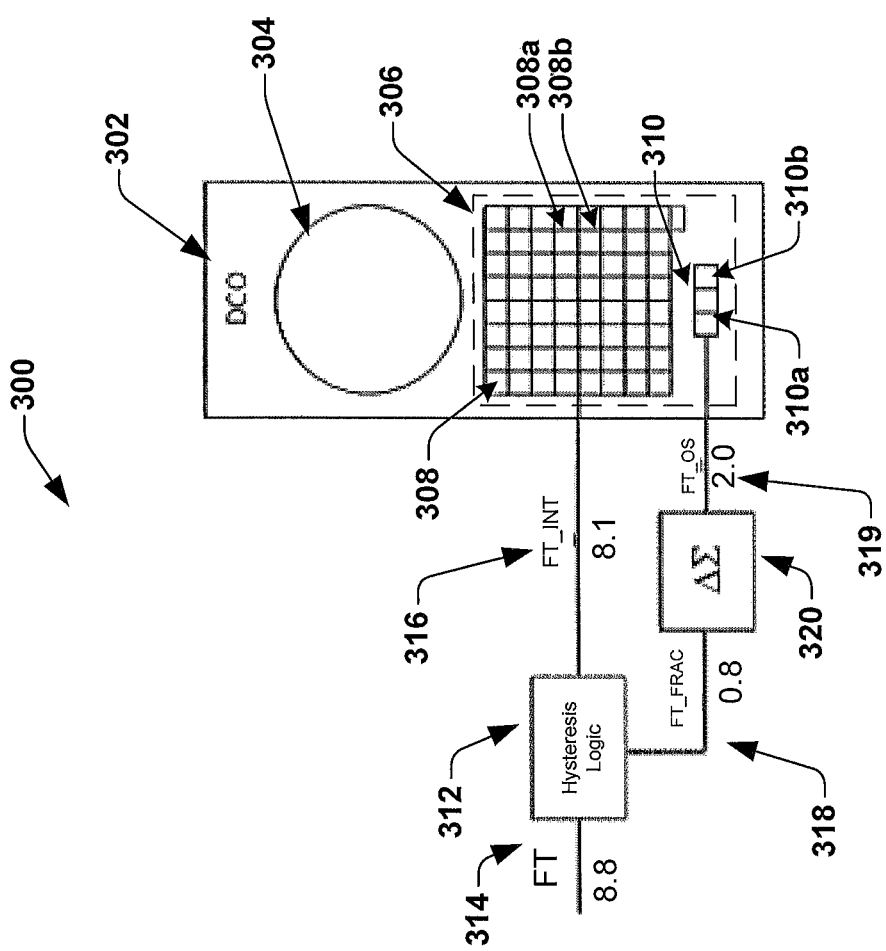
FIG. 3a illustrates another exemplary implementation of an oscillator circuit, according to one embodiment of the disclosure.

FIG. 3*a* illustrates another exemplary implementation of an oscillator circuit 300, according to one embodiment of the disclosure. In some embodiments, the oscillator circuit 300 comprises another possible way of implementation of the oscillator circuit 100 in FIG. 1. In some embodiments, the oscillator circuit 300 is configured to process an input tuning codeword based on processing an integer tuning codeword and a fractional tuning codeword. In some embodiments, the integer tuning codeword comprises one or more redundant fractional bits associated therewith. In some embodiments, the oscillator circuit 300 comprises a digitally controlled oscillator circuit 302, a hysteresis logic circuit 312 and a modulation circuit 320. In some embodiments, the DCO circuit 302 is configured to generate an output signal at a predefined oscillation frequency. In some embodiments, the DCO circuit 302 comprises a coil circuit 304 and a tuning circuit 306. In some embodiments, the coil circuit 304 comprises an inductor. In some embodiments, the tuning circuit 306 is configured to tune the oscillation frequency of the DCO circuit 302. In some embodiments, the tuning circuit 306 is configured to tune the oscillation frequency of the DCO circuit 302 based on processing an input tuning codeword (e.g., the input tuning codeword 314).

In some embodiments, the input tuning codeword 314 comprises a set of integer bits and a set of fractional bits. In this embodiment, the input tuning codeword 314 is shown to be an 8.8 bit codeword comprising 8 integer bits and 8 fractional bits. However, in other embodiments, the input tuning codeword 314 may comprise a N.M bits codeword comprising N integer bits and M fractional bits, where N and M may be any number. In some embodiments, the tuning circuit 306 is configured to tune the oscillation frequency of the DCO circuit 302 based on processing an integer tuning codeword 316 and a fractional tuning codeword 318 associated with the input tuning codeword 314. In some embodiments, the integer tuning codeword 316 comprises an integer tuning range associated therewith and the fractional tuning codeword 318 comprises a fractional tuning range associated therewith.

In some embodiments, the tuning circuit 304 comprises an integer tuning circuit 308 and a fractional tuning circuit 310. In some embodiments, the integer tuning circuit 308 comprises a plurality of integer tuning capacitors 308*a*, 308*b* etc. In some embodiments, the integer tuning circuit 308 is configured to process the integer tuning codeword 316 based on switching the plurality of integer tuning capacitors, in order to implement the input tuning codeword 314. In some embodiments, the fractional tuning circuit 310 comprises a plurality of fractional tuning capacitors. In some embodiments, the fractional tuning circuit 310 is configured to process the fractional tuning codeword 318 based on switching the plurality of fractional tuning capacitors, in order to implement the input tuning word 314. In some embodiments, the fractional tuning circuit 310 is configured to process the fractional tuning codeword 318 based on processing an oversampled integer codeword 319 derived based on the fractional tuning codeword 318. In some embodiments, the oversampled integer codeword 319 comprises an oversampled version of the fractional tuning codeword 318. In some embodiments, the modulation circuit 320 is configured to convert the fractional tuning codeword 318 to the oversampled integer codeword 319.

In this embodiment, the fractional tuning range associated with the fractional tuning codeword 318 is configured to cover two steps of the integer tuning range associated with the integer tuning codeword 316. However, in other embodiments, the fractional tuning range associated with the fractional tuning codeword 318 may be configured to cover more than two steps of the integer tuning range associated with the integer tuning codeword 316. In order to cover with the fractional tuning range, two steps of the integer tuning range, in this embodiment, a redundant fractional bit is utilized. Therefore, in this embodiment, the integer tuning codeword 316 comprises a redundant fractional bit in addition to 8 integer bits (corresponding to the 8 integer bits of the input tuning codeword 314) and the fractional tuning codeword 318 comprises 8 fractional bits (corresponding to the 8 fractional bits of the input tuning codeword 314). In other words, in this embodiment, the integer tuning codeword 316 comprises an 8.1 bit codeword and the fractional tuning codeword 318 comprises a 0.8 bit codeword. In some embodiments, the redundant fractional bit associated with the integer tuning codeword 316 comprises a least significant bit (LSB) of the integer tuning codeword 316. In some embodiments, the redundant fractional bit (i.e., the LSB) associated with the integer tuning codeword 316 is redundant to a most significant bit (MSB) of the fractional tuning codeword 318. In other embodiments, however, the redundant fractional bit associated with the integer tuning codeword 316 may comprise two or more redundant fractional bits (i.e., the redundant region covers more than 1 LSB of the integer tuning codeword 316), in order to enable the fractional tuning range to cover more than two steps of the integer tuning range. For example, in one embodiment, the integer tuning codeword 316 may comprise 2 redundant fractional bits, in order to enable the fractional tuning range to cover up to 4 steps of the integer tuning range. In such embodiments, the two or more redundant fractional bits are configured to be redundant to two or more bits (e.g., MSBs) associated with the fractional tuning codeword 318.

In some embodiments, the plurality of integer tuning capacitors associated with the integer tuning circuit 308 comprises a set of unit capacitors to process the integer bits associated with the integer tuning codeword 316 and one half capacitor to cover for the fractional bit associated with the integer tuning codeword 316. In this embodiment, the plurality of integer tuning capacitors comprises 256 unit capacitors configured to process the 8 bit integer part of the integer tuning codeword 316 and one half capacitor to process the fractional bit. However, in other embodiments, the plurality of integer tuning capacitors may be implemented differently. Similarly, in some embodiments, the plurality of fractional tuning capacitors associated with the fractional tuning circuit 310 comprises a plurality of unit capacitors. In this embodiment, the plurality of fractional tuning capacitors comprises 3 unit capacitors configured to process the 2 bit oversampled codeword 319 derived based on the 0.8 bit fractional tuning codeword 316. However, in other embodiments, the plurality of fractional tuning capacitors may be implemented differently, based on the number of bits associated with the fractional tuning codeword 316.

In some embodiments, the redundant fractional bit enables to create overlapping fractional regions. As can be seen in tuning graph 350 in FIG. 3b, due to the redundant fractional bit in the integer tuning codeword, each integer step is only half the original integer step. Therefore, in this embodiment, the fractional tuning range associated with the fractional tuning codeword covers 2 steps of the integer tuning range, thereby creating overlapping fractional regions. In some embodiments, the x-axis of the tuning graph 350 depicts the integer tuning codeword (e.g., the integer tuning codeword 316) and the y-axis of the tuning graph 350 depicts the effective input tuning codeword (e.g., the input tuning codeword 314). As a result of the overlapping fractional regions, at any instance, an input tuning codeword can be implemented using two possible integer tuning codes and their associated fractional tuning codes, as can be seen in the tuning graph 350 in FIG. 3b. For example, in order to implement an input tuning codeword of 0.75 (see y-axis), in one instance, the integer tuning codeword may be set to 0 and the fractional tuning codeword may be set to 0.75. However, in another instance, the integer tuning codeword may be set to 0.5 and the fractional tuning codeword may be set to 0.25, in order to implement the input tuning codeword of 0.75.

Figure 3B:
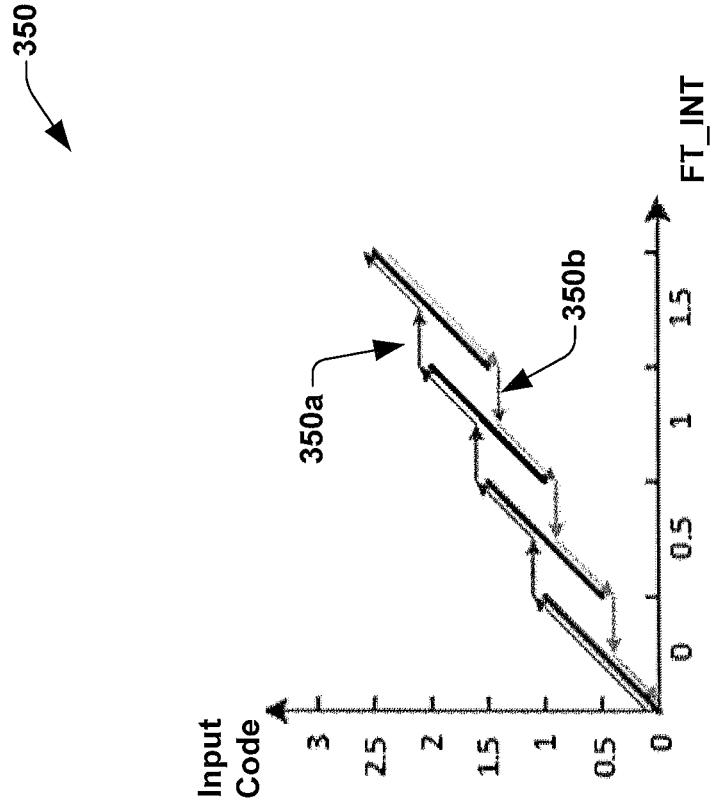

In some embodiments, the integer tuning codeword 316 and the fractional tuning codeword 318 is set, based on the input tuning codeword 314, in accordance with a change direction of the input tuning codeword 314. In particular, in some embodiments, the redundant fractional bit associated with the integer tuning codeword is set, in accordance with the change direction of the input tuning codeword. For example, as can be seen in FIG. 3b, if the input tuning codeword is increasing, the redundant fractional bit associated with the integer tuning codeword is set in accordance with the tuning curve 350a. Similarly, if the input tuning codeword is decreasing, the redundant fractional bit associated with the integer tuning codeword is set in accordance with the tuning curve 350b. In particular, in this embodiment, if the change direction of the input tuning codeword is from 0 to 0.75, then the input tuning codeword of 0.75 is implemented by setting the integer tuning codeword to 0 (based on setting the redundant fractional bit to 0, in accordance with the tuning curve 350a) and the fractional tuning codeword to 0.75. Similarly, if the change direction of the input tuning codeword is from 1 to 0.75, then the input tuning codeword of 0.75 is implemented by setting the integer tuning codeword to 0.5 (based on setting the redundant fractional bit to 1, in accordance with the tuning curve 350b) and the fractional tuning codeword to 0.25. However, in other embodiments, the integer tuning codeword 316 and the fractional tuning codeword 318 may be set, based on some other criteria.

Referring back to FIG. 3a, in some embodiments, the oscillator circuit 300 further comprises a hysteresis logic circuit 312 configured to receive the input tuning codeword 314, and split the input tuning codeword 314 to form the integer tuning codeword 316 and the fractional tuning codeword 318. In some embodiments, the hysteresis logic circuit 312 is configured to derive the integer tuning codeword 316 and the fractional tuning codeword 318, based on the input tuning codeword 314, in accordance with a change direction of the input tuning codeword 314. In particular, in some embodiments, the hysteresis logic circuit 312 is configured to set the redundant fractional bit associated with the integer tuning codeword 316, in accordance with the change direction of the input tuning codeword 314, in order to derive the integer tuning codeword 316. However, in other embodiments, the hysteresis logic circuit 312 may be configured to set the redundant fractional bit associated with the integer tuning codeword 316 based on some other criteria. Upon determining the integer tuning codeword 316, in some embodiments, the hysteresis logic circuit 312 is configured to subtract the integer tuning codeword 316 from the input tuning codeword 314, in order to derive the fractional tuning codeword 318. Therefore, in some embodiments, the hysteresis logic circuit 312 may be configured to split the input tuning codeword into a first integer tuning codeword and a corresponding first fractional tuning codeword, for increasing input tuning codeword, and the hysteresis logic circuit 312 may be configured to split the input tuning codeword into a second, different, integer tuning codeword and a corresponding second fractional tuning codeword, for decreasing input tuning codeword. However, in other embodiments, the hysteresis logic circuit 312 may be configured to set the integer tuning codeword 316 and the fractional tuning codeword 318, differently.

Figure 4:
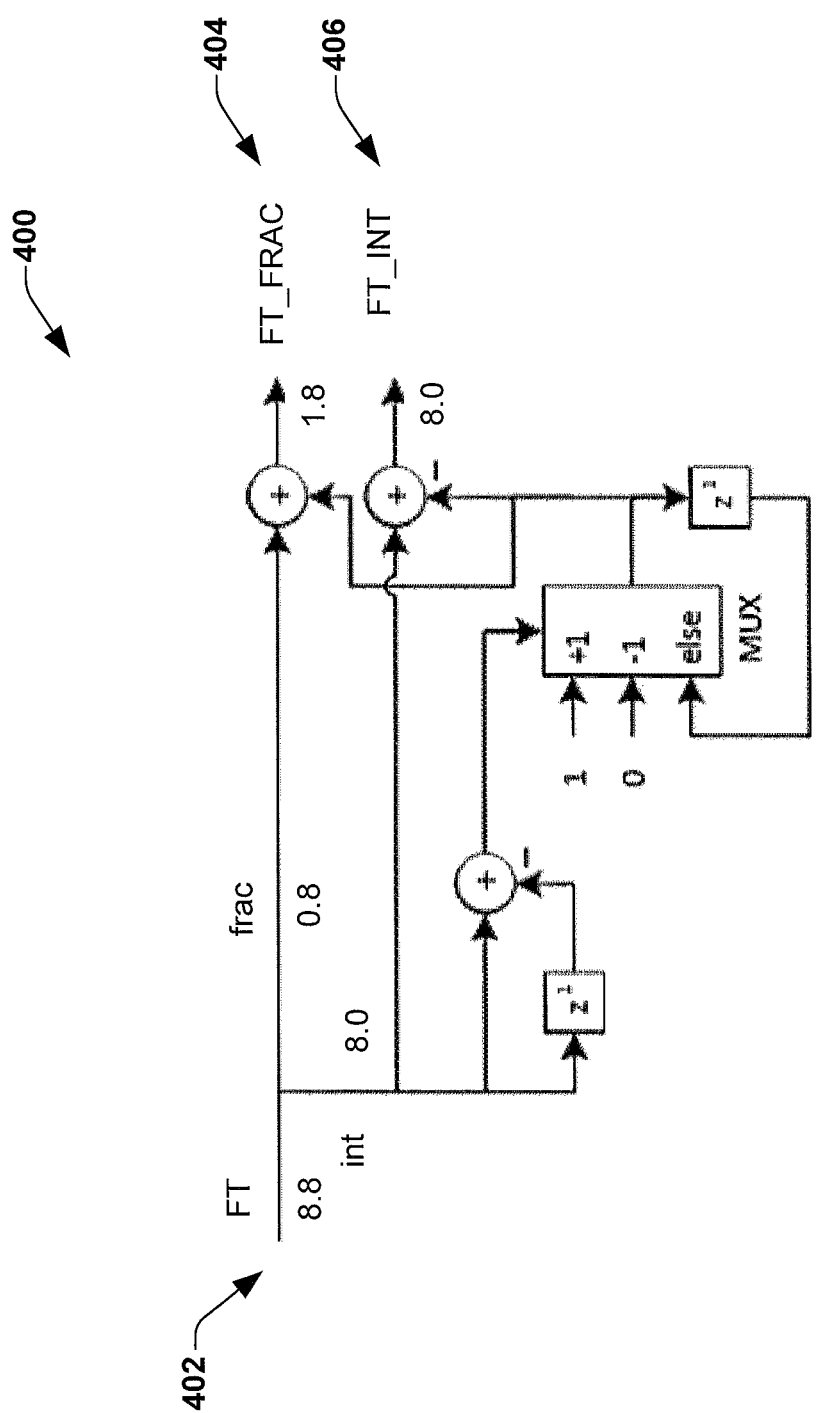
FIG. 4 illustrates an example implementation of a hysteresis logic circuit for a redundant integer bit, according to one embodiment of the disclosure.

FIG. 4 illustrates an example implementation of a hysteresis logic circuit 400 for a redundant integer bit, according to one embodiment of the disclosure. In some embodiments, the hysteresis logic circuit 400 may be included within the hysteresis logic circuit 212 in FIG. 2. Therefore, the hysteresis logic circuit 212 is explained herein with reference to the tuning graph 250 in FIG. 2b. In some embodiments, the hysteresis logic circuit 400 is configured to provide the integer tuning codeword 406 and the fractional tuning codeword 404 based on the input tuning codeword 402. In particular, in some embodiments, the hysteresis logic circuit 400 is configured to set the redundant integer bit associated with the fractional tuning codeword 404 based on a change direction of the input tuning codeword 402. In some embodiments, the hysteresis logic circuit 400 is configured to set the redundant integer bit associated with the fractional tuning codeword 404 based on a change direction of the integer part of the input tuning codeword 402. For example, if the change is +1 (e.g., a change of the input tuning codeword from 0 to 1.5 as explained above with respect to FIG. 3b), the hysteresis logic circuit is configured to increase the fractional tuning codeword by 1, which corresponds to setting the MSB (i.e., the redundant integer bit) of the fractional tuning codeword to 1. Further, the hysteresis logic circuit 400 is configured to reduce the integer tuning codeword by 1, as the sum of the correction has to be zero.

If the change in the input tuning codeword (or the integer part) is −1, the fractional tuning codeword and the integer tuning codeword is not modified from the input tuning codeword. That is, the integer tuning codeword is set according to the integer part of the input tuning codeword 402 and the fractional tuning codeword 404 is set according to the fractional part of the input tuning codeword 402. Further, if the change in the input tuning codeword is by more than one integer or if it is zero, the hysteresis logic circuit 400 is configured to keep the same correction as in the previous cycle. Although not shown, other implementations of the hysteresis logic circuit are also contemplated to be within the scope of this disclosure.

Figure 5:
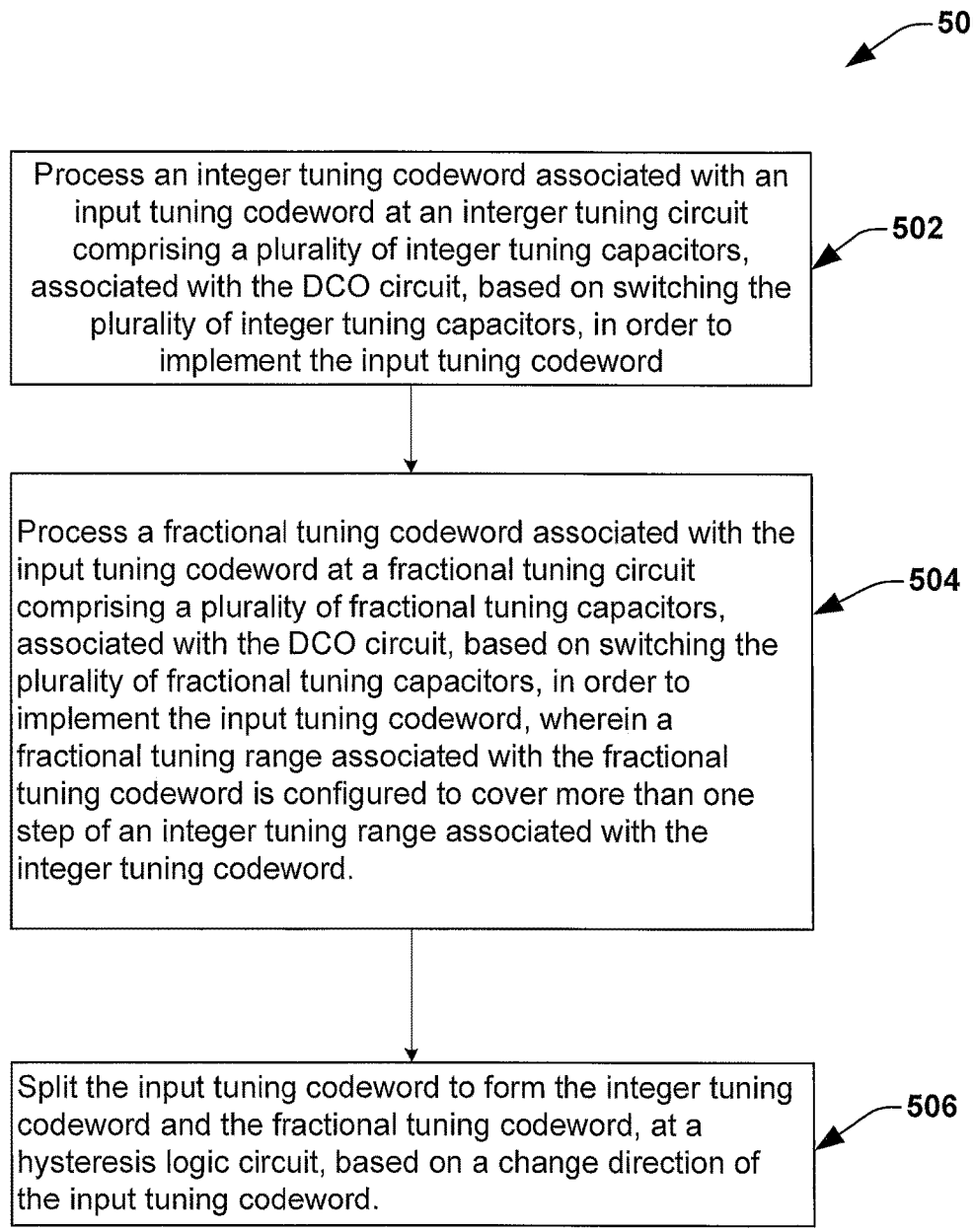
FIG. 5 illustrates a flow chart of a method for tuning an oscillation frequency of a digitally controlled oscillator (DCO) circuit, according to one embodiment of the disclosure.

FIG. 5 illustrates a flow chart of a method 500 for tuning an oscillation frequency of a digitally controlled oscillator (DCO) circuit, according to one embodiment of the disclosure. The method 500 is explained herein with reference to the oscillator circuit 100 in FIG. 1, the oscillator circuit 200 in FIG. 2a and the oscillator circuit 300 in FIG. 3a. At 502, an integer tuning codeword (e.g., the integer tuning codeword 116 in FIG. 1) associated with an input tuning codeword (e.g., the input tuning codeword 114 in FIG. 1) is processed at an integer tuning circuit (e.g., the integer tuning circuit 108 in FIG. 1), in order to implement the input tuning codeword. In some embodiments, the integer tuning circuit comprises a plurality of integer tuning capacitors (e.g., the integer tuning circuit 208 in FIG. 2a or the integer tuning circuit 308 in FIG. 3a). In some embodiments, the integer tuning codeword is processed at the integer tuning circuit based on switching the plurality of integer tuning capacitors. In some embodiments, the integer tuning codeword comprises an integer tuning range associated therewith. At 504, a fractional tuning codeword (e.g., the fractional tuning codeword 118 in FIG. 1) associated with the input tuning codeword is processed at a fractional tuning circuit (e.g., the fractional tuning circuit 110 in FIG. 1), in order to implement the input tuning codeword. In some embodiments, the fractional tuning circuit comprises a plurality of fractional tuning capacitors (e.g., the fractional tuning circuit 210 in FIG. 2a or the fractional tuning circuit 310 in FIG. 3a). In some embodiments, the fractional tuning codeword is processed at the fractional tuning circuit based on switching the plurality of fractional tuning capacitors. In some embodiments, the fractional tuning codeword comprises a fractional tuning range associated therewith. In some embodiments, processing the fractional tuning codeword, at the fractional tuning circuit, comprises processing an oversampled integer codeword derived based on the fractional tuning codeword.

In some embodiments, the fractional tuning range associated with the fractional tuning codeword is configured to cover more than one step of the integer tuning range associated with the integer tuning codeword. In order to cover with the fractional tuning range, more than one step of the integer tuning range, in some embodiments, one or more redundant bits are utilized. In some embodiments, the one or more redundant bit comprises one or more redundant integer bits, as explained above with respect to FIG. 2a and FIG. 2b. Alternately, in other embodiments, the one or more redundant bits comprises one or more redundant fractional bits, as explained above with respect to FIG. 3a and FIG. 3b. At 506, the input tuning codeword is split to form the integer tuning codeword and the fractional tuning codeword, at a hysteresis logic circuit. In some embodiments, the input tuning codeword is split to form the integer tuning codeword and the fractional tuning codeword, at the hysteresis logic circuit, based on a change direction of the input tuning codeword, as explained above with respect to FIG. 2b and FIG. 3b.

While the methods are illustrated and described above as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

While the apparatus has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application.

While the invention has been illustrated, and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is an oscillator circuit, comprising a digitally controlled oscillator (DCO) circuit, comprising a tuning circuit configured to tune an oscillation frequency of the DCO circuit based on processing an integer tuning codeword and a fractional tuning codeword associated with an input tuning codeword, wherein the input tuning codeword comprises a set of integer bits and a set of fractional bits, and wherein the tuning circuit comprises an integer tuning circuit configured to process the integer tuning codeword based on switching a plurality of integer tuning capacitors associated therewith, in order to implement the input tuning codeword, wherein the integer tuning codeword comprises an integer tuning range associated therewith; and a fractional tuning circuit configured to process the fractional tuning codeword based on switching a plurality of fractional tuning capacitors associated therewith, in order to implement the input tuning word, wherein the fractional tuning codeword comprises a fractional tuning range associated therewith; wherein the fractional tuning range associated with the fractional tuning codeword is configured to cover more than one step of the integer tuning range associated with the integer tuning codeword.

Example 2 is an oscillator circuit, including the subject matter of example 1, wherein the integer tuning codeword comprises a set of integer bits corresponding to the set of integer bits associated with the input tuning codeword, and wherein the fractional tuning codeword comprises a set of fractional bits corresponding to the set of fractional bits associated with the input tuning codeword and a redundant integer bit, wherein the redundant integer bit is redundant to a bit associated with the integer tuning codeword, in order to enable the fractional tuning range to cover two steps of the integer tuning range.

Example 3 is an oscillator circuit, including the subject matter of examples 1-2, including or omitting elements, wherein the redundant integer bit comprises a most significant bit (MSB) of the fractional tuning codeword and wherein the MSB of fractional tuning codeword is redundant to a least significant bit (LSB) of the integer tuning codeword.

Example 4 is an oscillator circuit, including the subject matter of examples 1-3, including or omitting elements, wherein the redundant integer bit comprises two or more redundant integer bits, wherein the two or more redundant integer bits are redundant to two or more bits associated with the integer tuning word, respectively, in order to enable the fractional tuning range to cover more than two steps of the integer tuning range.

Example 5 is an oscillator circuit, including the subject matter of examples 1-4, including or omitting elements, wherein the fractional tuning codeword comprises a set of fractional bits corresponding to the set of fractional bits associated with the input tuning codeword, and wherein the integer tuning codeword comprises a set of integer bits corresponding to the set of integer bits associated with the input tuning codeword and a redundant fractional bit, wherein the redundant fractional bit is redundant to a bit associated with the fractional tuning codeword, in order to enable the fractional tuning range to cover two steps of the integer tuning range.

Example 6 is an oscillator circuit, including the subject matter of examples 1-5, including or omitting elements, wherein the redundant fractional bit comprises a least significant bit (LSB) of the integer tuning codeword and wherein the LSB of the integer tuning codeword is redundant to a most significant bit (MSB) of the fractional tuning codeword.

Example 7 is an oscillator circuit, including the subject matter of examples 1-6, including or omitting elements, wherein the redundant fractional bit comprises two or more redundant integer bits, wherein the two or more redundant fractional bits are redundant to two or more bits associated with the fractional tuning word, respectively, in order to enable the fractional tuning range to cover more than two steps of the integer tuning range.

Example 8 is an oscillator circuit, including the subject matter of examples 1-7, including or omitting elements, further comprising a hysteresis logic circuit configured to split the input tuning codeword to form the integer tuning codeword and the fractional tuning codeword.

Example 9 is an oscillator circuit, including the subject matter of examples 1-8, including or omitting elements, wherein the hysteresis logic circuit is configured to split the input tuning codeword, based on a change direction of the input tuning codeword.

Example 10 is an oscillator circuit, including the subject matter of examples 1-9, including or omitting elements, wherein the hysteresis logic circuit is configured to split the input tuning codeword into a first integer tuning codeword and a corresponding first fractional tuning codeword, for increasing input tuning codeword, and wherein the hysteresis logic circuit is configured to split the input tuning codeword into a second, different, integer tuning codeword and a corresponding second fractional tuning codeword, for decreasing input tuning codeword.

Example 11 is an oscillator circuit, including the subject matter of examples 1-10, including or omitting elements, wherein the fractional tuning circuit is configured to process the fractional tuning codeword based on processing an oversampled integer codeword derived based on the fractional tuning codeword.

Example 12 is an oscillator circuit, including the subject matter of examples 1-11, including or omitting elements, further comprising a modulation circuit configured to convert the fractional tuning codeword into the oversampled integer codeword.

Example 13 is a digitally controlled oscillator (DCO) circuit, comprising a tuning circuit configured to tune an oscillation frequency of the DCO circuit based on processing an integer tuning codeword and a fractional tuning codeword associated with an input tuning codeword, wherein the input tuning codeword comprises a set of integer bits and a set of fractional bits, and wherein the tuning circuit comprises an integer tuning circuit configured to process the integer tuning codeword based on switching a plurality of integer tuning capacitors associated therewith, in order to implement the input tuning codeword, wherein the integer tuning codeword comprises an integer tuning range associated therewith; and a fractional tuning circuit configured to process the fractional tuning codeword based on switching a plurality of fractional tuning capacitors associated therewith, in order to implement the input tuning word, wherein the fractional tuning codeword comprises a fractional tuning range associated therewith; wherein the fractional tuning range associated with the fractional tuning codeword is configured to cover more than one step of the integer tuning range associated with the integer tuning codeword.

Example 14 is a DCO circuit, including the subject matter of example 13, wherein the integer tuning codeword comprises a set of integer bits corresponding to the set of integer bits associated with the input tuning codeword, and wherein the fractional tuning codeword comprises a set of fractional bits corresponding to the set of fractional bits associated with the input tuning codeword and a redundant integer bit, wherein the redundant integer bit is redundant to a bit associated with the integer tuning codeword, in order to enable the fractional tuning range to cover two steps of the integer tuning range.

Example 15 is a DCO circuit, including the subject matter of examples 13-14, including or omitting elements, wherein the redundant integer bit comprises a most significant bit (MSB) of the fractional tuning codeword and wherein the MSB of fractional tuning codeword is redundant to a least significant bit (LSB) of the integer tuning codeword.

Example 16 is a DCO circuit, including the subject matter of examples 13-15, including or omitting elements, wherein the redundant integer bit comprises two or more redundant integer bits, wherein the two or more redundant integer bits are redundant to two or more bits associated with the integer tuning word, respectively, in order to enable the fractional tuning range to cover more than two steps of the integer tuning range.

Example 17 is a DCO circuit, including the subject matter of examples 13-16, including or omitting elements, wherein the fractional tuning codeword comprises a set of fractional bits corresponding to the set of fractional bits associated with the input tuning codeword, and wherein the integer tuning codeword comprises a set of integer bits corresponding to the set of integer bits associated with the input tuning codeword and a redundant fractional bit, wherein the redundant fractional bit is redundant to a bit associated with the fractional tuning codeword, in order to enable the fractional tuning range to cover two steps of the integer tuning range.

Example 18 is a DCO circuit, including the subject matter of examples 13-17, including or omitting elements, wherein the redundant fractional bit comprises a least significant bit (LSB) of the integer tuning codeword and wherein the LSB of the integer tuning codeword is redundant to a most significant bit (MSB) of the fractional tuning codeword.

Example 19 is a DCO circuit, including the subject matter of examples 13-18, including or omitting elements, wherein the redundant fractional bit comprises two or more redundant integer bits, wherein the two or more redundant fractional bits are redundant to two or more bits associated with the fractional tuning word, respectively, in order to enable the fractional tuning range to cover more than two steps of the integer tuning range.

Example 20 is a DCO circuit, including the subject matter of examples 13-19, including or omitting elements, wherein the fractional tuning circuit is configured to process the fractional tuning codeword based on processing an oversampled integer codeword derived based on the fractional tuning codeword.

Example 21 is a method for tuning an oscillation frequency of a digitally controlled oscillator (DCO) circuit, comprising processing an integer tuning codeword associated with an input tuning codeword at an integer tuning circuit comprising a plurality of integer tuning capacitors, based on switching the plurality of integer tuning capacitors, in order to implement the input tuning codeword, wherein the integer tuning codeword comprises an integer tuning range associated therewith; and processing a fractional tuning codeword associated with the input tuning codeword at a fractional tuning circuit comprising a plurality of fractional tuning capacitors, associated with the DCO circuit, based on switching the plurality of fractional tuning capacitors, in order to implement the input tuning codeword, wherein the fractional tuning codeword comprises a fractional tuning range associated therewith; wherein the fractional tuning range associated with the fractional tuning codeword is configured to cover more than one step of the integer tuning range associated with the integer tuning codeword.

Example 22 is a method, including the subject matter of example 21, further comprising splitting the input tuning codeword to form the integer tuning codeword and the fractional tuning codeword, at a hysteresis logic circuit, based on a change direction of the input tuning codeword.

Example 23 is a method, including the subject matter of examples 21-22, including or omitting elements, wherein processing the fractional tuning codeword, at the fractional tuning circuit, comprises processing an oversampled integer codeword derived based on the fractional tuning codeword.

Example 24 is a method, including the subject matter of examples 21-23, including or omitting elements, wherein the integer tuning codeword comprises a set of integer bits corresponding to the set of integer bits associated with the input tuning codeword, and wherein the fractional tuning codeword comprises a set of fractional bits corresponding to the set of fractional bits associated with the input tuning codeword and a redundant integer bit, wherein the redundant integer bit is redundant to a bit associated with the integer tuning codeword, in order to enable the fractional tuning range to cover two steps of the integer tuning range.

Example 25 is a method, including the subject matter of examples 21-24, including or omitting elements, wherein the redundant integer bit comprises a most significant bit (MSB) of the fractional tuning codeword and wherein the MSB of fractional tuning codeword is redundant to a least significant bit (LSB) of the integer tuning codeword.

Example 26 is a method, including the subject matter of examples 21-25, including or omitting elements, wherein the redundant integer bit comprises two or more redundant integer bits, wherein the two or more redundant integer bits are redundant to two or more bits associated with the integer tuning word, respectively, in order to enable the fractional tuning range to cover more than two steps of the integer tuning range.

Example 27 is a method, including the subject matter of examples 21-26, including or omitting elements, wherein the fractional tuning codeword comprises a set of fractional bits corresponding to the set of fractional bits associated with the input tuning codeword, and wherein the integer tuning codeword comprises a set of integer bits corresponding to the set of integer bits associated with the input tuning codeword and a redundant fractional bit, wherein the redundant fractional bit is redundant to a bit associated with the fractional tuning codeword, in order to enable the fractional tuning range to cover two steps of the integer tuning range.

Example 28 is a method, including the subject matter of examples 21-27, including or omitting elements, wherein the redundant fractional bit comprises a least significant bit (LSB) of the integer tuning codeword and wherein the LSB of the integer tuning codeword is redundant to a most significant bit (MSB) of the fractional tuning codeword.

Example 29 is a method, including the subject matter of examples 21-28, including or omitting elements, wherein the redundant fractional bit comprises two or more redundant integer bits, wherein the two or more redundant fractional bits are redundant to two or more bits associated with the fractional tuning word, respectively, in order to enable the fractional tuning range to cover more than two steps of the integer tuning range.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. An oscillator circuit, comprising:
  a digitally controlled oscillator (DCO) circuit, comprising:
    a tuning circuit configured to tune an oscillation frequency of the DCO circuit based on processing an integer tuning codeword and a fractional tuning codeword associated with an input tuning codeword, wherein the input tuning codeword comprises a set of integer bits and a set of fractional bits, and wherein the tuning circuit comprises:
      an integer tuning circuit configured to process the integer tuning codeword based on switching a plurality of integer tuning capacitors associated therewith, in order to implement the input tuning codeword, wherein the integer tuning codeword comprises an integer tuning range associated therewith; and
      a fractional tuning circuit configured to process the fractional tuning codeword based on switching a plurality of fractional tuning capacitors associated therewith, in order to implement the input tuning word, wherein the fractional tuning codeword comprises a fractional tuning range associated therewith;
    wherein the fractional tuning range associated with the fractional tuning codeword is configured to cover more than one step of the integer tuning range associated with the integer tuning codeword.

2. The oscillator circuit of claim 1, wherein the integer tuning codeword comprises a set of integer bits corresponding to the set of integer bits associated with the input tuning codeword, and wherein the fractional tuning codeword comprises a set of fractional bits corresponding to the set of fractional bits associated with the input tuning codeword and a redundant integer bit, wherein the redundant integer bit is redundant to a bit associated with the integer tuning codeword, in order to enable the fractional tuning range to cover two steps of the integer tuning range.

3. The oscillator circuit of claim 2, wherein the redundant integer bit comprises a most significant bit (MSB) of the fractional tuning codeword and wherein the MSB of fractional tuning codeword is redundant to a least significant bit (LSB) of the integer tuning codeword.

4. The oscillator circuit of claim 2, wherein the redundant integer bit comprises two or more redundant integer bits, wherein the two or more redundant integer bits are redundant to two or more bits associated with the integer tuning word, respectively, in order to enable the fractional tuning range to cover more than two steps of the integer tuning range.

5. The oscillator circuit of claim 1, wherein the fractional tuning codeword comprises a set of fractional bits corresponding to the set of fractional bits associated with the input tuning codeword, and wherein the integer tuning codeword comprises a set of integer bits corresponding to the set of integer bits associated with the input tuning codeword and a redundant fractional bit, wherein the redundant fractional bit is redundant to a bit associated with the fractional tuning codeword, in order to enable the fractional tuning range to cover two steps of the integer tuning range.

6. The oscillator circuit of claim 5, wherein the redundant fractional bit comprises a least significant bit (LSB) of the integer tuning codeword and wherein the LSB of the integer tuning codeword is redundant to a most significant bit (MSB) of the fractional tuning codeword.

7. The oscillator circuit of claim 5, wherein the redundant fractional bit comprises two or more redundant integer bits, wherein the two or more redundant fractional bits are redundant to two or more bits associated with the fractional tuning word, respectively, in order to enable the fractional tuning range to cover more than two steps of the integer tuning range.

8. The oscillator circuit of claim 1, further comprising a hysteresis logic circuit configured to split the input tuning codeword to form the integer tuning codeword and the fractional tuning codeword.

9. The oscillator circuit of claim 8, wherein the hysteresis logic circuit is configured to split the input tuning codeword, based on a change direction of the input tuning codeword.

10. The oscillator circuit of claim 9, wherein the hysteresis logic circuit is configured to split the input tuning codeword into a first integer tuning codeword and a corresponding first fractional tuning codeword, for increasing input tuning codeword, and wherein the hysteresis logic circuit is configured to split the input tuning codeword into a second, different, integer tuning codeword and a corresponding second fractional tuning codeword, for decreasing input tuning codeword.

11. The oscillator circuit of claim 1, wherein the fractional tuning circuit is configured to process the fractional tuning codeword based on processing an oversampled integer codeword derived based on the fractional tuning codeword.

12. The oscillator circuit of claim 11, further comprising a modulation circuit configured to convert the fractional tuning codeword into the oversampled integer codeword.

13. A digitally controlled oscillator (DCO) circuit, comprising:
a tuning circuit configured to tune an oscillation frequency of the DCO circuit based on processing an integer tuning codeword and a fractional tuning codeword associated with an input tuning codeword, wherein the input tuning codeword comprises a set of integer bits and a set of fractional bits, and wherein the tuning circuit comprises:
an integer tuning circuit configured to process the integer tuning codeword based on switching a plurality of integer tuning capacitors associated therewith, in order to implement the input tuning codeword, wherein the integer tuning codeword comprises an integer tuning range associated therewith; and
a fractional tuning circuit configured to process the fractional tuning codeword based on switching a plurality of fractional tuning capacitors associated therewith, in order to implement the input tuning word, wherein the fractional tuning codeword comprises a fractional tuning range associated therewith;
wherein the fractional tuning range associated with the fractional tuning codeword is configured to cover more than one step of the integer tuning range associated with the integer tuning codeword.

14. The DCO circuit of claim 13, wherein the integer tuning codeword comprises a set of integer bits corresponding to the set of integer bits associated with the input tuning codeword, and wherein the fractional tuning codeword comprises a set of fractional bits corresponding to the set of fractional bits associated with the input tuning codeword and a redundant integer bit, wherein the redundant integer bit is redundant to a bit associated with the integer tuning codeword, in order to enable the fractional tuning range to cover two steps of the integer tuning range.

15. The DCO circuit of claim 14, wherein the redundant integer bit comprises a most significant bit (MSB) of the fractional tuning codeword and wherein the MSB of fractional tuning codeword is redundant to a least significant bit (LSB) of the integer tuning codeword.

16. The DCO circuit of claim 14, wherein the redundant integer bit comprises two or more redundant integer bits, wherein the two or more redundant integer bits are redundant to two or more bits associated with the integer tuning word, respectively, in order to enable the fractional tuning range to cover more than two steps of the integer tuning range.

17. The DCO circuit of claim 13, wherein the fractional tuning codeword comprises a set of fractional bits corresponding to the set of fractional bits associated with the input tuning codeword, and wherein the integer tuning codeword comprises a set of integer bits corresponding to the set of integer bits associated with the input tuning codeword and a redundant fractional bit, wherein the redundant fractional bit is redundant to a bit associated with the fractional tuning codeword, in order to enable the fractional tuning range to cover two steps of the integer tuning range.

18. The DCO circuit of claim 17, wherein the redundant fractional bit comprises a least significant bit (LSB) of the integer tuning codeword and wherein the LSB of the integer tuning codeword is redundant to a most significant bit (MSB) of the fractional tuning codeword.

19. The DCO circuit of claim 17, wherein the redundant fractional bit comprises two or more redundant integer bits, wherein the two or more redundant fractional bits are redundant to two or more bits associated with the fractional tuning word, respectively, in order to enable the fractional tuning range to cover more than two steps of the integer tuning range.

20. The DCO circuit of claim 13, wherein the fractional tuning circuit is configured to process the fractional tuning codeword based on processing an oversampled integer codeword derived based on the fractional tuning codeword.

21. A method for tuning an oscillation frequency of a digitally controlled oscillator (DCO) circuit, comprising:
processing an integer tuning codeword associated with an input tuning codeword at an integer tuning circuit comprising a plurality of integer tuning capacitors, based on switching the plurality of integer tuning capacitors, in order to implement the input tuning codeword, wherein the integer tuning codeword comprises an integer tuning range associated therewith; and
processing a fractional tuning codeword associated with the input tuning codeword at a fractional tuning circuit comprising a plurality of fractional tuning capacitors, associated with the DCO circuit, based on switching the plurality of fractional tuning capacitors, in order to implement the input tuning codeword, wherein the fractional tuning codeword comprises a fractional tuning range associated therewith;
wherein the fractional tuning range associated with the fractional tuning codeword is configured to cover more than one step of the integer tuning range associated with the integer tuning codeword.

22. The method of claim 21, further comprising splitting the input tuning codeword to form the integer tuning codeword and the fractional tuning codeword, at a hysteresis logic circuit, based on a change direction of the input tuning codeword.

23. The method of claim 21, wherein processing the fractional tuning codeword, at the fractional tuning circuit, comprises processing an oversampled integer codeword derived based on the fractional tuning codeword.

24. The method of claim 21, wherein the integer tuning codeword comprises a set of integer bits corresponding to the set of integer bits associated with the input tuning codeword, and wherein the fractional tuning codeword comprises a set of fractional bits corresponding to the set of fractional bits associated with the input tuning codeword and a redundant integer bit, wherein the redundant integer bit is redundant to a bit associated with the integer tuning codeword, in order to enable the fractional tuning range to cover two steps of the integer tuning range.

25. The method of claim 24, wherein the redundant integer bit comprises a most significant bit (MSB) of the fractional tuning codeword and wherein the MSB of fractional tuning codeword is redundant to a least significant bit (LSB) of the integer tuning codeword.

26. The method of claim 24, wherein the redundant integer bit comprises two or more redundant integer bits, wherein the two or more redundant integer bits are redundant to two or more bits associated with the integer tuning word, respectively, in order to enable the fractional tuning range to cover more than two steps of the integer tuning range.

27. The method of claim 21, wherein the fractional tuning codeword comprises a set of fractional bits corresponding to the set of fractional bits associated with the input tuning codeword, and wherein the integer tuning codeword comprises a set of integer bits corresponding to the set of integer bits associated with the input tuning codeword and a redundant fractional bit, wherein the redundant fractional bit is redundant to a bit associated with the fractional tuning codeword, in order to enable the fractional tuning range to cover two steps of the integer tuning range.

28. The method of claim 27, wherein the redundant fractional bit comprises a least significant bit (LSB) of the integer tuning codeword and wherein the LSB of the integer tuning codeword is redundant to a most significant bit (MSB) of the fractional tuning codeword.

29. The method of claim 27, wherein the redundant fractional bit comprises two or more redundant integer bits, wherein the two or more redundant fractional bits are redundant to two or more bits associated with the fractional tuning word, respectively, in order to enable the fractional tuning range to cover more than two steps of the integer tuning range.

* * * * *